(12) United States Patent
Sato et al.

(10) Patent No.: US 8,809,900 B2
(45) Date of Patent: Aug. 19, 2014

(54) LIGHT EMITTING DIODE DEVICE AND PRODUCING METHOD THEREOF

(75) Inventors: Satoshi Sato, Osaka (JP); Hisataka Ito, Osaka (JP); Yasunari Ooyabu, Osaka (JP); Yuki Shinbori, Osaka (JP)

(73) Assignee: Nitto Denko Corporation, Osaka (JP)

( * ) Notice: Subject to any disclaimer, the term of this patent is extended or adjusted under 35 U.S.C. 154(b) by 25 days.

(21) Appl. No.: 13/429,681

(22) Filed: Mar. 26, 2012

(65) Prior Publication Data
US 2012/0248484 A1    Oct. 4, 2012

(30) Foreign Application Priority Data

Mar. 28, 2011  (JP) ................................. 2011-069768
Apr. 1, 2011   (JP) ................................. 2011-081854

(51) Int. Cl.
| H01L 33/00 | (2010.01) |
| H01L 21/00 | (2006.01) |
| H01L 33/46 | (2010.01) |
| H01L 33/60 | (2010.01) |
| H01L 33/40 | (2010.01) |

(52) U.S. Cl.
CPC ............... *H01L 33/46* (2013.01); *H01L 33/60* (2013.01); *H01L 33/405* (2013.01)
USPC .......................................... 257/100; 438/29

(58) Field of Classification Search
USPC .................... 257/13, 79–103, 918, 257/E51.018–E51.022, E33.001–E33.077, 257/E33.054, E25.028, E25.032; 438/22–47, 69, 493, 503, 507, 956
See application file for complete search history.

(56) References Cited

U.S. PATENT DOCUMENTS

| 2005/0139851 | A1  | 6/2005  | Sato |
| 2006/0060867 | A1* | 3/2006  | Suehiro ........................ 257/81 |
| 2009/0101929 | A1  | 4/2009  | Mo et al. |
| 2009/0140633 | A1* | 6/2009  | Tanimoto et al. ............. 313/503 |
| 2010/0320479 | A1  | 12/2010 | Minato et al. |
| 2011/0147774 | A1* | 6/2011  | Wang et al. ..................... 257/98 |

FOREIGN PATENT DOCUMENTS

| JP | 2005-191420 A | 7/2005 |
| JP | 2007-19096 A  | 1/2007 |
| JP | 2009-111102 A | 5/2009 |
| JP | 2011-501428 A | 1/2011 |
| WO | 2009/069671 A1 | 6/2009 |

OTHER PUBLICATIONS

Notice of Reasons for Refusal, dispatched Apr. 30, 2014, issued by the Japanese Patent Office, in counterpart Application No. 2011-081854.

* cited by examiner

*Primary Examiner* — Colleen Matthews
*Assistant Examiner* — Junaiden Mirsalahuddin
(74) *Attorney, Agent, or Firm* — Sughrue Mion, PLLC

(57) ABSTRACT

A method for producing a light emitting diode device includes the steps of preparing a base board; allowing a light semiconductor layer where an electrode portion is provided at one side in a thickness direction to be disposed in opposed relation to the base board, and the electrode portion to be electrically connected to a terminal, so that the light semiconductor layer is flip-chip mounted on the base board; forming an encapsulating resin layer containing a light reflecting component at the other side of the base board so as to cover the light semiconductor layer and the electrode portion; removing the other side portion of the encapsulating resin layer so as to expose the light semiconductor layer; and forming a phosphor layer formed in a sheet state so as to be in contact with the other surface of the light semiconductor layer.

2 Claims, 4 Drawing Sheets

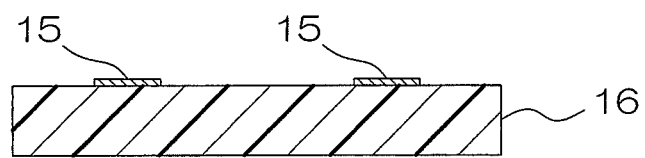
FIG.1
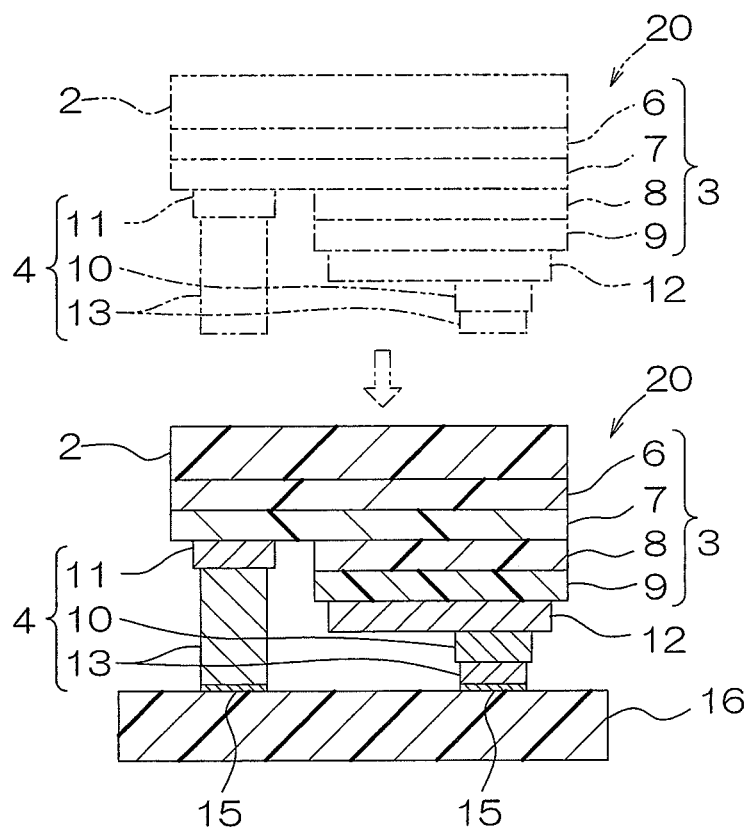
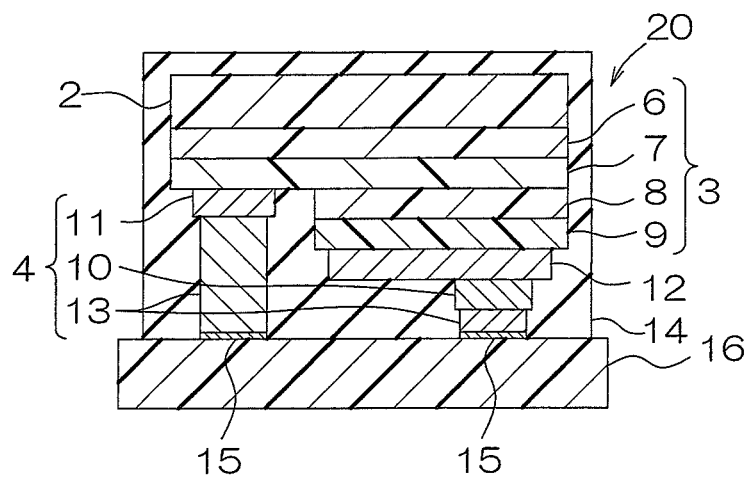

(d)

(e)

(a)

(b)

LIGHT EMITTING DIODE DEVICE AND PRODUCING METHOD THEREOF

CROSS-REFERENCE TO RELATED APPLICATION

The present application claims priority from Japanese Patent Applications No. 2011-069768 filed on Mar. 28, 2011 and No. 2011-081854 filed on Apr. 1, 2011, the contents of which are hereby incorporated by reference into this application.

BACKGROUND OF THE INVENTION

1. Field of the Invention

The present invention relates to a light emitting diode device and a producing method thereof, to be specific, to a producing method of a light emitting diode device and a light emitting diode device obtained by the method.

2. Description of Related Art

In recent years, as a light emitting device that is capable of emitting high-energy light, a white light emitting device has been known. In the white light emitting device, for example, a base board, an LED (light emitting diode) laminated thereon, emitting blue light, a phosphor layer that can convert the blue light into yellow light and covers the LED, and an encapsulating layer that encapsulates the LED are provided. The white light emitting device emits high-energy white light by color mixing of the blue light emitted from the LED, which is encapsulated by the encapsulating layer and to which electric power is supplied from the base board, transmitting through the encapsulating layer and the phosphor layer, and the yellow light that is converted in wavelength from a part of the blue light in the phosphor layer.

As a method for producing the white light emitting device, for example, the following method has been proposed (ref: for example, Japanese Unexamined Patent Publication No. 2005-191420).

The proposed method is as follows. That is, a base, which has a board portion and a white reflecting frame portion protruding from the circumference portion thereof toward the upper side, is first formed. Next, a semiconductor light emitting element is subjected to wire bonding in a bottom portion of a concave portion, which is formed at the center of the board portion by the reflecting frame portion, so as to be spaced apart from the inner side of the reflecting frame portion.

Next, a mixture of a phosphor and an epoxy resin in a liquid state is filled in the concave portion by application, subsequently the phosphor is spontaneously precipitated in the bottom portion of the concave portion, and then the epoxy resin is heat cured.

In the white light emitting device obtained by the method proposed in Japanese Unexamined Patent Publication No. 2005-191420, the phosphor layer (a wavelength conversion layer) that contains the phosphor formed by a precipitation at high concentrations is defined in a region at the upper side of the semiconductor light emitting element and an encapsulating portion that contains the epoxy resin at high concentrations is defined in a region at the upper side of the phosphor layer.

In the white light emitting device, the semiconductor light emitting element emits the blue light in a radial manner. Of the emitted blue light, a part thereof emitted from the semiconductor light emitting element toward the upper side is converted into the yellow light in the phosphor layer and the remaining light transmits through the phosphor layer. The blue light emitted from the semiconductor light emitting element toward the side is reflected at the reflecting frame portion and then toward the upper side. The white light emitting device in Japanese Unexamined Patent Publication No. 2005-191420 emits the white light by color mixing of the blue light and the yellow light.

SUMMARY OF THE INVENTION

However, the phosphor layer in Japanese Unexamined Patent Publication No. 2005-191420 is a region defined according to a difference in concentration of the phosphor that is produced by a spontaneous precipitation of the phosphor in the mixture, so that a thickness of the phosphor layer easily becomes non-uniform. In that case, there is a disadvantage that efficiency of the wavelength conversion in the phosphor layer becomes non-uniform and the white light emitting device emits uneven white light.

To form the phosphor layer, the above-described spontaneous precipitation is used, so that long hours are required. In addition, it is necessary to control the hours strictly, so that a production process becomes complicated. As a result, there is a disadvantage that production costs are increased.

In addition, there is also a disadvantage that the semiconductor light emitting element is spaced apart from the reflecting frame portion, so that a part of the light emitted from the semiconductor light emitting element toward the side is absorbed in the encapsulating portion before being reflected at the reflecting frame portion and therefore, extraction efficiency of the light is reduced.

Furthermore, in the white light emitting device in Japanese Unexamined Patent Publication No. 2005-191420, the phosphor layer and the encapsulating portion are sequentially formed on the semiconductor light emitting element, so that even when heat, which is produced when the semiconductor light emitting element emits light, is transmitted to the phosphor layer that contains the phosphor at high concentrations, the heat is thereafter easily stored by the encapsulating portion that contains the epoxy resin at high concentrations. Thus, there is a disadvantage that a heat dissipation of the semiconductor light emitting element at the time of the emission becomes insufficient and as a result, luminous efficiency of the semiconductor light emitting element is reduced.

In the white light emitting device in Japanese Unexamined Patent Publication No. 2005-191420, there is a disadvantage that the semiconductor light emitting element is connected to the board portion by the wire bonding, so that brightness is reduced due to a shadow of a wire.

It is an object of the present invention to provide a producing method of a light emitting diode device that is capable of suppressing an increase in production costs, and preventing a reduction in luminous efficiency of a light semiconductor layer and emitting uniform white light to improve extraction efficiency of light, and a light emitting diode device obtained by the producing method.

The method for producing a light emitting diode device of the present invention, provided with a base board including a terminal and a light emitting diode element flip mounted on the base board, includes the steps of preparing the base board; allowing a light semiconductor layer where an electrode portion is provided at one side in a thickness direction to be disposed in opposed relation to the base board in the thickness direction, and the electrode portion to be electrically connected to the terminal, so that the light semiconductor layer is flip-chip mounted on the base board; forming an encapsulating resin layer containing a light reflecting component at the other side in the thickness direction of the base board so as to cover the light semiconductor layer and the electrode portion; removing the other side portion in the thickness direction of the encapsulating resin layer so as to expose the light semiconductor layer; and forming a phosphor layer formed in a sheet state so as to be in contact with the other surface in the thickness direction of the light semiconductor layer to form the light emitting diode element including the phosphor layer, the light semiconductor layer, and the electrode portion.

In the method for producing the light emitting diode device of the present invention, it is preferable that in the process of removing the other side portion in the thickness direction of the encapsulating resin layer, the other side portion in the thickness direction of the light semiconductor layer is removed.

A light emitting diode device of the present invention includes a base board and a light emitting diode element flip mounted on the base board, wherein the light emitting diode element includes a phosphor layer formed in a sheet state, a light semiconductor layer formed at one surface in a thickness direction of the phosphor layer, an electrode portion formed at one surface in the thickness direction of the light semiconductor layer so as to be connected to the light semiconductor layer, and an encapsulating resin layer, containing a light reflecting component, formed at one side in the thickness direction of the phosphor layer so as to cover the light semiconductor layer and the electrode portion and to expose one surface in the thickness direction of the electrode portion.

In the method for producing the light emitting diode device of the present invention, the phosphor layer in a sheet state is formed, so that the uniform phosphor layer can be reliably formed. Therefore, a uniform wavelength conversion can be achieved in the phosphor layer. As a result, the light emitting diode device of the present invention obtained by the method for producing the light emitting diode device of the present invention can emit uniform white light.

In the method for producing the light emitting diode device of the present invention, the phosphor layer, which is formed in a sheet state in advance, is formed, so that the phosphor layer can be easily formed in a short time. Therefore, an increase in the production costs can be suppressed.

In addition, in the method for producing the light emitting diode device of the present invention, the encapsulating resin layer that contains the light reflecting component is formed so as to cover the light semiconductor layer, so that light emitted from the light semiconductor layer is reflected by the light reflecting component of the encapsulating resin layer before being absorbed by another member. Therefore, the extraction efficiency of the light can be improved.

Furthermore, in the light emitting diode device of the present invention obtained by the method for producing the light emitting diode device of the present invention, the phosphor layer is formed at the other surface in the thickness direction of the light semiconductor layer, so that heat of the light semiconductor layer can be dissipated toward the other side in the thickness direction via the phosphor layer. Therefore, a reduction in the luminous efficiency of the light semiconductor layer can be prevented.

In the method for producing the light emitting diode device of the present invention, the light semiconductor layer is flip-chip mounted on the base board, so that the brightness can be improved and the extraction efficiency can be further improved.

BRIEF DESCRIPTION OF THE DRAWINGS

FIG. 1 shows process drawings for illustrating one embodiment of a method for producing a light emitting diode device of the present invention:

(a) illustrating a step of preparing a base board,
(b) illustrating a step of allowing a light semiconductor layer to be flip mounted on the base board, and
(c) illustrating a step of forming an encapsulating resin layer.

Figure 2:
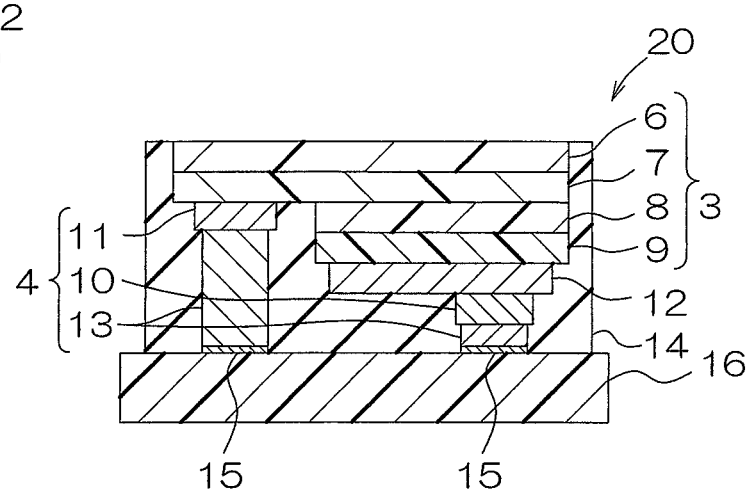
Figure 2:
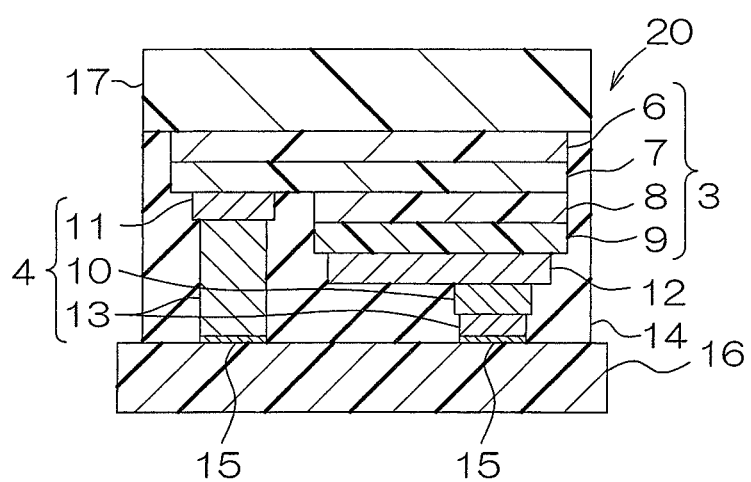

FIG. 2 shows process drawings for illustrating one embodiment of a method for producing the light emitting diode device of the present invention, subsequent to FIG. 1:

(d) illustrating a step of removing an upper side portion of the encapsulating resin layer and a supporting board and
(e) illustrating a step of forming a phosphor layer.

Figure 3:
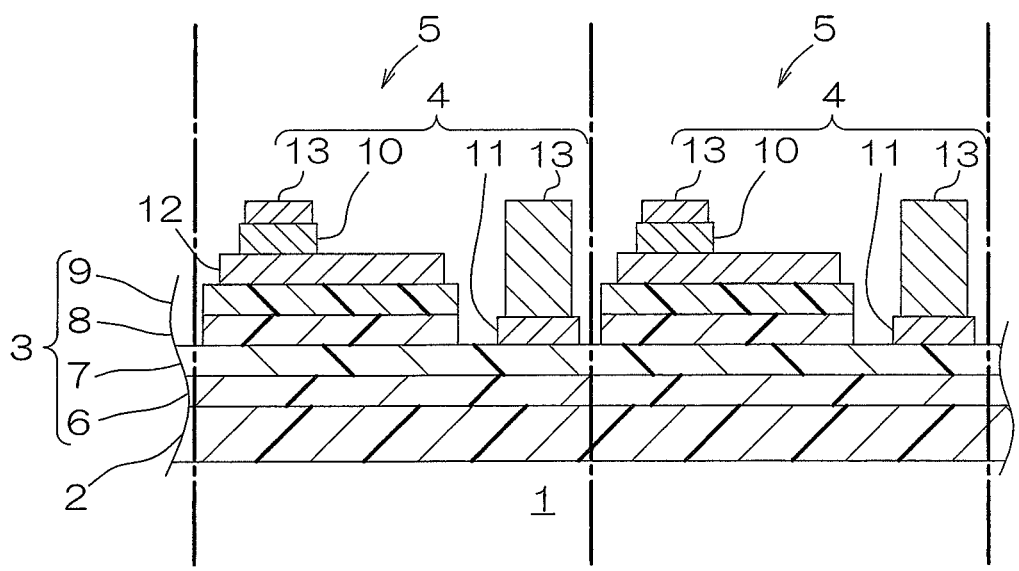

FIG. 3 shows a sectional view for illustrating a step of preparing the light semiconductor layer shown in FIG. 1(b).

Figure 4:
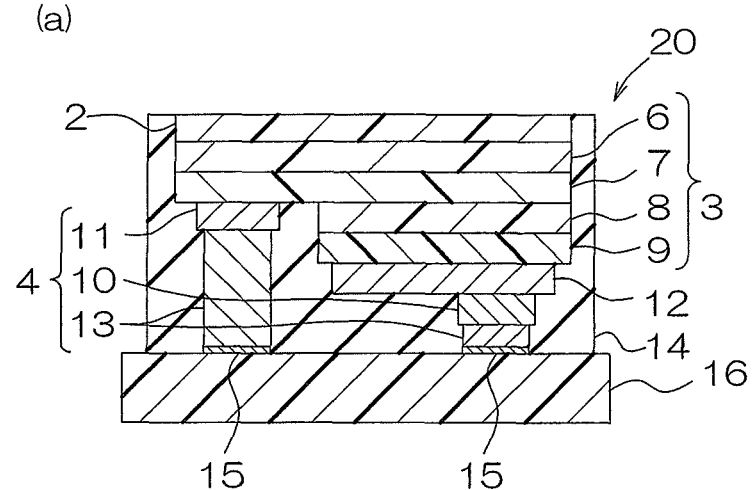
Figure 4:
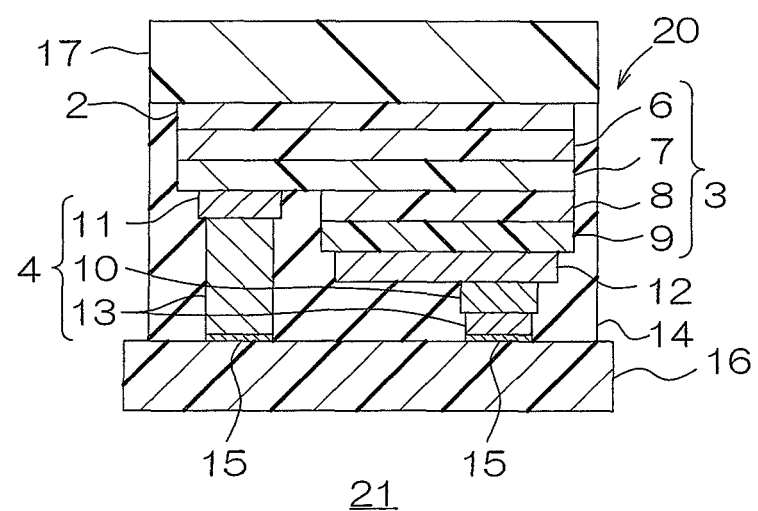

FIG. 4 shows process drawings for illustrating another embodiment (an embodiment in which the supporting board is allowed to remain partially) of a method for producing the light emitting diode device of the present invention:

(a) illustrating a step of allowing the supporting board to remain partially and
(b) illustrating a step of forming the phosphor layer on the upper surface of the supporting board.

DETAILED DESCRIPTION OF THE INVENTION

FIGS. 1 and 2 show process drawings for illustrating one embodiment of a method for producing a light emitting diode device of the present invention. FIG. 3 shows a sectional view for illustrating a step of preparing the light semiconductor layer shown in FIG. 1(b).

In FIG. 2(e), a light emitting diode device 21, which is one embodiment of a light emitting diode of the present invention, includes a base board 16 and a light emitting diode element 20 that is flip mounted on the base board 16.

The base board 16 is formed into a generally flat plate shape. To be specific, the base board 16 is formed of a laminated plate in which a conductive layer, as a circuit pattern, is laminated on an insulating board. The insulating board is formed of, for example, a silicon board, a ceramic board, a polyimide resin board, or the like. Preferably, the insulating board is formed of the ceramic board, to be specific, a sapphire ($Al_2O_3$) board. The conductive layer is formed of, for example, a conductor such as gold, copper, silver, or nickel. The conductors can be used alone or in combination.

The conductive layer includes a terminal 15.

The terminals 15 are formed at spaced intervals in a plane direction on the upper surface of the insulating board and are formed into a pattern corresponding to a bump 13 to be described later. Although not shown, the terminal 15 is electrically connected to an electric power supply portion via the conductive layer.

The light emitting diode element 20 is provided on the base board 16 and includes a phosphor layer 17, a light semiconductor layer 3 that is formed on the lower surface (one surface in a thickness direction) of the phosphor layer 17, an electrode portion 4 that is formed on the lower surface (one surface in the thickness direction) of the light semiconductor layer 3, and an encapsulating resin layer 14 that encapsulates the light semiconductor layer 3.

The phosphor layer 17 is formed into a sheet state.

The phosphor layer 17 is formed of, for example, a phosphor composition that contains a phosphor.

Preferably, the phosphor composition contains the phosphor and a resin.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include garnet type phosphor having a garnet type crystal structure such as $Y_3Al_5O_{12}$:Ce (YAG (yttrium aluminum garnet):Ce), (Y, Gd)$_3$Al$_5$O$_{12}$:Ce, Tb$_3$Al$_3$O$_{12}$:Ce, Ca$_3$Sc$_2$Si$_3$O$_{12}$:Ce, and Lu$_2$CaMg$_2$(Si, Ge)$_3$O$_{12}$:Ce; silicate phosphor such as (Sr, Ba)$_2$SiO$_4$:Eu, Ca$_3$SiO$_4$Cl$_2$:Eu, Sr$_3$SiO$_5$:Eu, Li$_2$SrSiO$_4$:Eu, and Ca$_3$Si$_2$O$_7$:Eu; aluminate phosphor such as CaAl$_{12}$O$_{19}$:Mn and SrAl$_2$O$_4$:Eu; sulfide phosphor such as ZnS:Cu,Al, CaS:Eu, CaGa$_2$S$_4$:Eu, and SrGa$_2$S$_4$:Eu; oxynitride phosphor such as CaSi$_2$O$_2$N$_2$:Eu, SrSi$_2$O$_2$N$_2$:Eu, BaSi$_2$O$_2$N$_2$:Eu, and Ca-α-SiAlON; nitride phosphor such as CaAlSiN$_3$:Eu and CaSi$_5$N$_8$:Eu; and fluoride-based phosphor such as K$_2$SiF$_6$:Mn and K$_2$TiF$_6$:Mn. Preferably, garnet type phosphor is used, or more preferably, Y$_3$Al$_5$O$_{12}$:Ce (YAG) is used.

The above-described phosphor is, for example, in the form of a particle and the average particle size thereof is in the range of, for example, 0.1 to 30 μm, or preferably 0.2 to 10 μm. The average particle size of the phosphor (a phosphor particle) is measured by a particle size distribution measurement device.

The phosphors can be used alone or in combination of two or more.

The mixing ratio of the phosphor is, for example, 1 to 50 weight %, or preferably 5 to 30 weight % with respect to the phosphor composition. The mixing ratio of the phosphor is, for example, 1 to 100 parts by mass, or preferably 5 to 40 parts by mass per 100 parts by mass of a resin.

The resin is a matrix in which the phosphor is dispersed, including, for example, transparent resins such as silicone resin, epoxy resin, and acrylic resin. Preferably, the silicone resin is used from the viewpoint of durability.

The silicone resin has, in its molecule, a main chain mainly composed of the siloxane bond (—Si—O—Si—) and a side chain, which is bonded to silicon atoms (Si) of the main chain, composed of an organic group such as an alkyl group (for example, a methyl group and the like) or an alkoxyl group (for example, a methoxy group).

To be specific, examples of the silicone resin include dehydration condensation type silicone resin, addition reaction type silicone resin, peroxide curable silicone resin, moisture curable silicone resin, and curable silicone resin. Preferably, the addition reaction type silicone resin is used.

The silicone resin has a kinetic viscosity at 25° C. in the range of, for example, 10 to 30 mm²/s.

The resins can be used alone or in combination of two or more.

The mixing ratio of the resin is, for example, 50 to 99 mass %, or preferably 70 to 95 mass % with respect to the phosphor composition.

The phosphor and the resin are blended at the above-described mixing ratio and are stirred and mixed, so that the phosphor composition is prepared.

The phosphor layer 17 has a thickness in the range of, for example, 20 to 500 μm, or preferably 50 to 300 μm.

The light semiconductor layer 3 is formed into a predetermined pattern at a central portion in the plane direction (the direction that is perpendicular to the thickness direction, that is, a right-left direction of the paper surface and a depth direction of the paper surface in FIG. 2(e)) on the lower surface of the phosphor layer 17.

The light semiconductor layer 3 is formed so as to be included in the phosphor layer 17 when projected in the thickness direction. To be specific, the light semiconductor layer 3 is formed at the central portion of the lower surface of the phosphor layer 17. The light semiconductor layer 3 includes a buffer layer 6 of the light semiconductor layer 3, an N-type semiconductor layer 7 that is formed thereunder, a light emitting layer 8 that is formed thereunder, and a P-type semiconductor layer 9 that is formed thereunder.

The buffer layer 6 is formed so as to correspond to the outer shape of the light semiconductor layer 3.

The buffer layer 6 buffers a mismatch of a lattice constant of the N-type semiconductor layer 7 to be described next.

An example of a buffer material for forming the buffer layer 6 includes a semiconductor such as elemental semiconductor (single elemental semiconductor), oxide semiconductor, or compound semiconductor (except for the oxide semiconductor).

An example of the elemental semiconductor includes a Group 4B element (a Group 4B element in the long form of the periodic table, hereinafter the same) such as Si, Ge, and Sn.

Examples of the oxide semiconductor include an oxide of a typical element such as Al$_2$O$_3$, ZnO, and SnO$_2$, and an oxide of a transition element such as TiO$_2$, V$_2$O$_5$, Cr$_2$O$_3$, MnO$_2$, Fe$_2$O$_3$, NiO, and Cu$_2$O. These can be used alone or in combination.

The compound semiconductor is a compound in which a plurality of elements, except for O, are bonded. Examples thereof include a compound of a Group 3B element and a Group 5B element such as AlN, AlP, AlAs, AlSb, GaN, GaP, GaAs, GaSb, InN, InP, InAs, InSb, AlGaN, InGaN, AlInN, and AlGaInN and a compound of a Group 2B element and a Group 6B element such as ZnS, SnSe, and ZnTe. Preferably, the compound of the Group 3B element and the Group 5B element is used.

Of the above-described semiconductors, preferably, the compound semiconductor is used.

The buffer layer 6 has a thickness in the range of, for example, 0.5 to 200 nm, or preferably 1 to 100 nm.

The N-type semiconductor layer 7 is formed on the entire lower surface of the buffer layer 6. An N-type semiconductor for forming the N-type semiconductor layer 7 is not particularly limited and a known N-type semiconductor is used. For example, an impurity semiconductor obtained by doping (adding) an impurity such as the Group 5B element or the Group 4B element into the above-described semiconductor in minute amounts is used.

The thickness of the N-type semiconductor layer 7 is not particularly limited and is in the range of, for example, 10 nm to 10 μm.

The light emitting layer 8 is, on the lower surface of the N-type semiconductor layer 7, formed into a predetermined pattern at one side end portion in the plane direction (the right side in FIG. 2(e)). That is, the light emitting layer 8 exposes the lower surface of the N-type semiconductor layer 7 at the other side end portion in the plane direction (the left side in FIG. 2(e)).

An example of a light emitting material for forming the light emitting layer 8 includes the same semiconductor as those illustrated in the buffer layer 6 described above. Preferably, the compound semiconductor is used.

The light emitting layer 8 has a thickness in the range of, for example, 20 to 300 nm, or preferably 30 to 200 nm.

The P-type semiconductor layer 9 is, on the entire lower surface of the light emitting layer 8, formed into the same pattern as that of the light emitting layer 8. A P-type semiconductor for forming the P-type semiconductor layer 9 is not particularly limited and a known P-type semiconductor is used. For example, an impurity semiconductor obtained by doping (adding) an impurity such as the Group 3B element or the Group 2A element into the above-described semiconductor in minute amounts is used. An example of the Group 2A element includes an alkaline earth metal such as Be and Mg.

The thickness of the P-type semiconductor layer 9 is not particularly limited and is in the range of, for example, 10 nm to 10 μm.

The electrode portion 4 is electrically connected to the light semiconductor layer 3 and includes an anode electrode 10 and a cathode electrode 11.

The anode electrode 10 is formed under the P-type semiconductor layer 9 so as to sandwich a transparent electrode 12 with the P-type semiconductor layer 9 and is electrically connected to the P-type semiconductor layer 9 via the transparent electrode 12.

The transparent electrode 12 is formed on the lower surface of the P-type semiconductor layer 9 and is disposed so as to be included in the P-type semiconductor layer 9 when projected in the thickness direction. An example of an electrode material for forming the transparent electrode 12 includes a metal oxide such as indium tin oxide (ITO), zinc oxide (ZnO), and tin oxide ($SnO_2$). The transparent electrode 12 has a thickness in the range of, for example, 10 to 300 nm, or preferably 20 to 200 nm.

The anode electrode 10 is formed into a pattern of being included in the transparent electrode 12 when projected in the thickness direction.

Examples of the electrode material for forming the anode electrode 10 include gold and aluminum. Preferably, gold is used. The anode electrode 10 has a thickness in the range of, for example, 10 to 300 nm, or preferably 20 to 200 nm.

The cathode electrode 11 is formed under the N-type semiconductor layer 7. To be specific, the cathode electrode 11 is formed on the lower surface of the N-type semiconductor layer 7 that is exposed from the P-type semiconductor layer 9 and the light emitting layer 8. The cathode electrode 11 is electrically connected to the N-type semiconductor layer 7.

Examples of the electrode material for forming the cathode electrode 11 include gold and aluminum. Preferably, gold is used. The cathode electrode 11 has a thickness in the range of, for example, 10 to 300 nm, or preferably 20 to 200 nm.

In the electrode portion 4, the bump 13 is provided.

The bump 13 is formed on the lower surface of the anode electrode 10 and that of the cathode electrode 11. Each of the bumps 13 is, in plane view, formed into a pattern of being included in the anode electrode 10 and the cathode electrode 11, respectively. The bump 13 is formed into substantially the same pattern as that of the terminal 15 of the base board 16 described above.

An example of a material for forming the bump 13 includes a conductor such as gold, silver, lead, tin, or alloys thereof (to be specific, solder and the like).

The thickness of each of the bumps 13 is adjusted so that before the light semiconductor layer 3 is flip-chip mounted on the base board 16, the lower surface of the bump 13 that is formed on the lower surface of the anode electrode 10 and that of the bump 13 that is formed on the lower surface of the cathode electrode 11 are the same in height (depth). That is, the thickness of each of the bumps 13 is adjusted so that the lower surfaces of the bumps 13 are in the same position (the position in the thickness direction) when each of the bumps 13 is projected in the plane direction.

The encapsulating resin layer 14 contains a light reflecting component. To be specific, the encapsulating resin layer 14 is formed of an encapsulating resin composition that contains an encapsulating material and the light reflecting component.

An example of the encapsulating material includes a thermosetting resin such as thermosetting silicone resin, epoxy resin, thermosetting polyimide resin, phenol resin, urea resin, melamine resin, unsaturated polyester resin, diallyl phthalate resin, and thermosetting urethane resin. Preferably, the thermosetting silicone resin or the epoxy resin is used.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (zinc carbonate) and calcium carbonate; and a clay mineral such as kaolin (kaolinite).

As the white inorganic pigment, preferably, the oxide is used or more preferably, the titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. For example, the crystal structure thereof is rutile, brookite (pyromelane), anatase (octahedrite), or the like. Preferably, the crystal structure thereof is rutile.

A crystal system of the titanium oxide is not particularly limited. For example, the crystal system thereof is a tetragonal system, an orthorhombic system, or the like. Preferably, the crystal system thereof is the tetragonal system.

When the crystal structure and the crystal system of the titanium oxide are rutile and the tetragonal system, respectively, it is possible to effectively prevent a reduction of the reflectance with respect to light (to be specific, visible light, among all, the light around the wavelength of 450 nm) even in a case where the encapsulating resin layer 14 is exposed to a high temperature for a long time.

The light reflecting component is in the form of a particle. The shape thereof is not limited and examples of the shape thereof include, for example, a sphere shape, a plate shape, and a needle shape. An average value of the maximum length (in a case of the sphere shape, the average particle size) of the light reflecting component is in the range of, for example, 1 to 1000 nm. The average value of the maximum length is measured by using a laser diffraction scattering particle size analyzer.

The mixing ratio of the light reflecting component per 100 parts by mass of the encapsulating material is, for example, 0.5 to 90 parts by mass, or preferably 1.5 to 70 parts by mass from the viewpoint of the coloring characteristics, the light reflectivity, and handling ability of the encapsulating resin composition.

The above-described light reflecting component is uniformly dispersed and mixed into the encapsulating material.

In addition, a filler can further be added into the encapsulating resin composition. That is, the filler can be used in combination with the light reflecting component (to be specific, the white pigment).

An example of the filler includes a known filler, except for the above-described white pigment. To be specific, an inorganic filler is used. Examples thereof include silica powder, talc powder, alumina powder, aluminum nitride powder, and silicon nitride powder.

Preferably, as the filler, the silica powder is used from the viewpoint of reducing a linear expansion coefficient of the encapsulating resin layer 14.

Examples of the silica powder include fused silica powder and crystalline silica powder. Preferably, the fused silica powder (that is, silica glass powder) is used.

Examples of the shape of the filler include, for example, a sphere shape, a plate shape, and a needle shape. Preferably, the sphere shape is used from the viewpoint of excellent filling characteristics and fluidity.

Therefore, preferably, the fused silica powder in a sphere shape is used as the silica powder.

The average value of the maximum length (in a case of the sphere shape, the average particle size) of the filler is in the range of, for example, 5 to 60 μm, or preferably 15 to 45 μm. The average value of the maximum length is measured by using the laser diffraction scattering particle size analyzer.

The addition ratio of the filler is adjusted so that the total amount of the filler and the light reflecting component per 100 parts by mass of the encapsulating resin is, for example, 10 to 80 parts by mass. And the addition ratio of the filler is adjusted so that the total amount of the filler and the light reflecting component per 100 parts by mass of the encapsulating resin is preferably 25 to 75 parts by mass, or more preferably 40 to 60 parts by mass from the view point of reducing the linear expansion coefficient and ensuring the fluidity.

The above-described encapsulating material, light reflecting component, and filler, which is added as required, are blended to be uniformly mixed, so that the encapsulating resin composition is prepared.

The encapsulating resin layer 14 is formed, under the phosphor layer 17 (one side in the thickness direction), so as to cover the side surfaces of the light semiconductor layer 3 and the electrode portion 4 and to expose the lower surfaces (one surface in the thickness direction) of the electrode portion 4.

To be specific, the side surfaces of the bump 13 corresponding to the anode electrode 10, the lower surface exposed from the bump 13 and the side surfaces of the anode electrode 10, the lower surface exposed from the anode electrode 10 and the side surfaces of the transparent electrode 12, the lower surface exposed from the transparent electrode 12 and the side surfaces of the P-type semiconductor layer 9, the side surfaces of the light emitting layer 8, the side surfaces of the N-type semiconductor layer 7, and the side surfaces of the buffer layer 6 are covered by the encapsulating resin layer 14. The lower surface of the bump 13 corresponding to the anode electrode 10 is exposed from the encapsulating resin layer 14. That is, the lower surface of the bump 13 corresponding to the anode electrode 10 is in contact with the upper surface of the terminal 15.

The side surfaces of the bump 13 corresponding to the cathode electrode 11, and the lower surface exposed from the bump 13 and the side surfaces of the cathode electrode 11 are covered by the encapsulating resin layer 14. The lower surface of the bump 13 corresponding to the cathode electrode 11 is exposed from the encapsulating resin layer 14. That is, the lower surface of the bump 13 corresponding to the cathode electrode 11 is in contact with the upper surface of the terminal 15.

In addition, the lower surface of the N-type semiconductor layer 7 (the lower surface of the N-type semiconductor layer 7 exposed from the light emitting layer 8 and the cathode electrode 11) is covered by the encapsulating resin layer 14.

Furthermore, the lower surface of the phosphor layer 17 exposed from the light semiconductor layer 3 is covered by the encapsulating resin layer 14.

In this way, the light semiconductor layer 3 is encapsulated by the encapsulating resin layer 14.

Next, a method for producing the light emitting diode device 21 shown in FIG. 2(e) is described with reference to FIGS. 1 and 2.

In this method, as shown in FIG. 1 (a), the above-described base board 16 is first prepared.

As referred in phantom lines in FIG. 1(b), the light semiconductor layer 3 is prepared.

The light semiconductor layer 3 is formed under a supporting board 2 together with the supporting board 2. The electrode portion 4 is provided under the light semiconductor layer 3.

To form the light semiconductor layer 3, for example, as referred in FIG. 3, the light semiconductor layer 3 and the electrode portion 4 are sequentially laminated on the supporting board 2.

The supporting board 2 is, for example, formed into a generally circular plate shape in plane view and supports the light semiconductor layer 3.

Examples of a supporting material for forming the supporting board 2 include $Al_2O_3$ (sapphire), SiC, Si, or GaN. Preferably, sapphire is used.

The supporting board 2 has a thickness in the range of, for example, 100 to 1000 μm, or preferably 200 to 800 μm.

As shown in FIG. 3, the light semiconductor layer 3 is laminated on the upper surface of the supporting board 2 in the above-described pattern, for example, by a known growth method such as an epitaxial growth method.

On the upper surface of the supporting board 2, a plurality of the light semiconductor layers 3 are disposed at spaced intervals to each other in the plane direction.

The buffer layer 6 is formed on the entire upper surface of the supporting board 2. The N-type semiconductor layer 7 is formed on the entire upper surface of the buffer layer 6. After performing the above-described growth method, a plurality of the light emitting layers 8 and the P-type semiconductor layers 9 are formed into the above-described pattern, for example, by an etching using a mask.

Subsequently, the electrode portion 4 is laminated on the upper surface of the light semiconductor layer 3 in the above-described pattern by a known patterning method.

Thereafter, as shown in dashed lines in FIG. 3, the supporting board 2, the buffer layer 6, and the N-type semiconductor layer 7, which are located between the light semiconductor layers 3, are subjected to a cutting process (a dicing process), so that the light semiconductor layers 3 are cut into plural pieces. That is, the light semiconductor layers 3 are individualized (singulated).

In this way, the light semiconductor layer 3 provided with the electrode portion 4 on the upper surface thereof and the supporting board 2 on the lower surface thereof is prepared.

Thereafter, as shown in the phantom lines in FIG. 1(b), the light semiconductor layer 3 shown in FIG. 3 is reversed upside down (turned over) to be disposed in opposed relation to the base board 16 in the thickness direction.

Subsequently, as shown by an arrow in the phantom lines in FIG. 1(b), the bump 13 is electrically connected to the terminal 15, so that the light semiconductor layer 3 is flip-chip mounted on the base board 16.

In the flip-chip mounting, the light semiconductor layer 3 is placed on the base board 16 so that the bump 13 and the terminal 15 are adjacent to each other in the thickness direction. Thereafter, the bump 13 is subjected to reflow, for example, by heating, ultrasonic wave, or the like. In this way, the bump 13 is allowed to be in contact with the terminal 15 in the thickness direction.

Next, as shown in FIG. 1(c), the encapsulating resin layer 14 is formed on the base board 16 (the other side in the thickness direction) so as to cover the supporting board 2, the light semiconductor layer 3, and the electrode portion 4.

To form the encapsulating resin layer 14, the above-described encapsulating resin composition is applied onto the base board 16 including the supporting board 2, the light semiconductor layer 3, and the electrode portion 4, for example, by an application method using a laminator or an applicator to form an encapsulating film. Thereafter, when the encapsulating material is the thermosetting resin, the encapsulating film is cured by the heating.

When the encapsulating resin composition is formed into a sheet state in advance, the encapsulating resin layer 14 can also be formed by placing the encapsulating resin composition on the base board 16 so as to bury the supporting board 2, the light semiconductor layer 3, and the electrode portion 4 to be cured by the heating.

In addition, when the encapsulating resin composition contains the thermosetting resin in the form of a powder, the encapsulating resin layer 14 can also be formed by allowing the encapsulating resin composition to be heated and subjected to compression molding to be cured with a compression molding machine.

In this way, the encapsulating resin layer 14 is formed.

To be specific, the encapsulating resin layer 14 covers the upper surface and the side surfaces of the supporting board 2, the lower surface and the side surfaces of the light semiconductor layer 3, and the side surfaces of the electrode portion 4.

Next, as shown in FIG. 2(d), the upper side portion of the encapsulating resin layer 14 that is in the upper side with respect to the upper surface of the light semiconductor layer 3 is removed so as to expose the light semiconductor layer 3.

To be specific, the upper side portion of the encapsulating resin layer 14 is removed and the supporting board 2 is removed.

In the removal of the upper side portion of the encapsulating resin layer 14 and the supporting board 2, for example, the above-described etching, machining (to be specific, grinding process and the like), or the like is used.

The supporting board 2 is removed and the encapsulating resin layer 14 in which the upper side portion is removed exposes the upper surface of the buffer layer 6. In this way, in the encapsulating resin layer 14, the upper surface thereof around the buffer layer 6 is formed to be flush with that of the buffer layer 6.

Next, as shown in FIG. 2(e), the phosphor layer 7 formed in a sheet state is formed so as to be in contact with the upper surface of the light semiconductor layer 3.

To form the phosphor layer 17, for example, the above-described phosphor composition is applied onto the upper surface of the light semiconductor layer 3 (the buffer layer 6) and that of the encapsulating resin layer 14 exposing the light semiconductor layer 3 to form a phosphor film in a sheet state (not shown).

Thereafter, the phosphor film is heated, for example, at 50 to 150° C. and is dried to be formed into a sheet state in the above-described pattern.

In this way, the phosphor layer 17 in a sheet state is formed.

In this way, the light emitting diode element 20 including the phosphor layer 17, the light semiconductor layer 3, and the electrode portion 4 can be formed. That way, the light emitting diode device 21 including the base board 16 and the light emitting diode element 20 that is flip mounted on the base board 16 is produced.

In the above-described method for producing the light emitting diode device 21, the phosphor layer 17 in a sheet state is formed, so that the uniform phosphor layer 17 can be reliably formed. Therefore, a uniform wavelength conversion can be achieved in the phosphor layer 17. As a result, the light emitting diode device 21 can emit uniform white light.

In the above-described method for producing the light emitting diode device 21, the phosphor layer 17, which is formed in a sheet state in advance, is formed, so that the phosphor layer 17 can be easily formed in a short time. Therefore, an increase in the production costs can be suppressed.

In addition, in the above-described method for producing the light emitting diode device 21, the encapsulating resin layer 14 that contains the light reflecting component is formed so as to cover the light semiconductor layer 3, so that light emitted from the light semiconductor layer 3 is reflected by the light reflecting component of the encapsulating resin layer 14 before being absorbed by another member. Therefore, the extraction efficiency of the light can be improved.

Furthermore, in the above-described light emitting diode device 21, the phosphor layer 17 is formed on the upper surface of the light semiconductor layer 3, so that heat of the light semiconductor layer 3 can be dissipated toward the upper side via the phosphor layer 17. Therefore, a reduction in the luminous efficiency of the light semiconductor layer 3 can be prevented.

In the above-described method for producing the light emitting diode device 21, the light semiconductor layer 3 is flip-chip mounted on the base board 16, so that the brightness can be improved and the extraction efficiency can be further improved.

FIG. 4 shows process drawings for illustrating another embodiment (an embodiment in which the supporting board is allowed to remain partially) of a method for producing the light emitting diode device of the present invention.

In FIG. 4, the same reference numerals are provided for members corresponding to each of those described above, and their detailed description is omitted.

In the embodiments in FIGS. 1 and 2, in FIG. 2(d), the entire supporting board 2 is removed. Alternatively, for examples, as shown in FIG. 4, a part of the supporting board 2 is removed and the supporting board 2 is allowed to remain partially. Thereafter, the phosphor layer 17 can be formed on the upper surface of the supporting board 2 that remains.

That is, as shown in FIG. 4(a), the upper side portion of the supporting board 2 is removed and the lower side portion of the supporting board 2 is allowed to remain. The lower side portion of the supporting board 2 is formed to be flush with the upper surface of the encapsulating resin layer 14 around the supporting board 2.

The thickness of the supporting board 2 after the removal of the upper side portion with respect to the thickness thereof before the removal of the upper side portion is, for example, 80% or less, or preferably 30% or less, and usually 1% or more and to be specific, in the range of, for example, 320 μm or less, or preferably 10 to 120 μm.

When the thickness of the supporting board 2 after the removal of the upper side portion exceeds the above-described range, the extraction efficiency of the light and heat dissipation efficiency may be reduced. On the other hand, when the thickness of the supporting board 2 after the removal of the upper side portion is below the above-described range, the light semiconductor layer 3 may not be able to be sufficiently supported.

Next, as shown in FIG. 4(b), the phosphor layer 17 is formed on the upper surface of the supporting board 2 and that of the encapsulating resin layer 14.

In this way, the light emitting diode device 21 including the base board 16 and the light emitting diode element 20 in which the supporting board 2 remains in the light semiconductor layer 3 is obtained.

In the light emitting diode device 21 in FIG. 4(b), the light semiconductor layer 3 is supported by the supporting board 2 that remains, so that damage of the light semiconductor layer 3 at the time of removal of the upper side portion of the encapsulating resin layer 14 can be effectively prevented.

In the light emitting diode device 21 in FIG. 2(e) with respect to the light emitting diode device 21 in FIG. 4(b), the phosphor layer 17 is in contact with the upper surface of the light semiconductor layer 3, so that the light emitted from the light semiconductor layer 3 directly reaches the phosphor layer 17. Therefore, it is possible to improve the wavelength conversion efficiency, so that the luminous efficiency of the light emitting diode device 21 is improved.

EXAMPLES

While the present invention will be described hereinafter in further detail with reference to Examples, the present invention is not limited to these Examples.

Example 1

A base board in which a conductive layer including a terminal made of copper, nickel, and gold was laminated on the upper surface of an insulating board made of sapphire ($Al_2O_3$), having a thickness of 1 mm was prepared (ref: FIG. 1(a)).

A supporting board made of sapphire having a thickness of 450 μm was prepared (ref: FIG. 3). Subsequently, by an epitaxial growth method, a buffer layer made of GaN having a thickness of 30 nm, an N-type semiconductor layer made of N-type GaN (n-GaN:Si, hereinafter shown in the same manner) obtained by doping Si having a thickness of 5 μm, a light emitting layer made of InGaN having a thickness of 120 nm, and a P-type semiconductor layer made of p-GaN:Mg having a thickness of 50 nm were sequentially formed on the supporting board in the above-described pattern (ref: FIG. 3).

Next, an electrode portion was formed on the upper surface of a light semiconductor layer so as to be connected thereto by a patterning method (ref: FIG. 3).

That is, a transparent electrode made of ITO having a thickness of 50 nm was formed on the P-type semiconductor layer and subsequently, an anode electrode made of gold having a thickness of 50 nm was formed on the transparent electrode. At the same time, a cathode electrode made of gold having a thickness of 50 nm was formed on the N-type semiconductor layer.

Subsequently, a bump made of gold was formed on the anode electrode and on the cathode electrode, respectively.

To be specific, the thickness of the bump on the anode electrode and that on the cathode electrode were adjusted so that the upper surfaces of the bumps were the same in height when the bumps were projected in the plane direction (ref: FIG. 3).

Thereafter, the supporting board, the buffer layer, and the N-type semiconductor layer, which were located between the light semiconductor layers, were subjected to a dicing process, so that the light semiconductor layers were cut into plural pieces. That is, the light semiconductor layers were singulated (ref: dashed lines in FIG. 3).

In this way, the light semiconductor layer provided with the supporting board and the electrode portion was prepared.

Next, the prepared light semiconductor layer was turned over (reversed upside down) and the light semiconductor layer was disposed in opposed relation to the base board (ref: FIG. 1(b)).

Thereafter, the bump was subjected to reflow by heating and the bump was allowed to be in contact with the terminal, so that the bump was electrically connected to the terminal directly and the light semiconductor layer was flip-chip mounted on the base board.

Next, an encapsulating resin layer was formed on the base board so as to cover the supporting board, the light semiconductor layer, and the electrode portion (ref: FIG. 1(c)).

To be specific, 100 parts by mass of thermosetting silicone resin, and 20 parts by mass of a particle of titanium oxide ($TiO_2$: tetragonal system of rutile) in a sphere shape having an average particle size of 300 nm were uniformly mixed, so that an encapsulating resin composition in a paste state was prepared. Subsequently, the prepared encapsulating resin composition was applied onto the base board including the supporting board, the light semiconductor layer, and the electrode portion to form an encapsulating film in a semi-cured state (in a B-stage state). Thereafter, the encapsulating film was cured by heating.

In this way, the supporting board, the light semiconductor layer, and the electrode portion were encapsulated by the encapsulating resin layer (ref: FIG. 1(c)).

Next, the upper side portion of the encapsulating resin layer and the supporting board were removed by a grinding process (ref: FIG. 2(d)).

In this way, the upper surface of the light semiconductor layer was exposed from the encapsulating resin layer. The upper side portion of the encapsulating resin layer was flush with the upper surface of the buffer layer.

Next, the phosphor layer formed in a sheet state having a thickness of 75 μm was formed so as to be in contact with the upper surface of the light semiconductor layer (ref: FIG. 2(e)).

To be specific, 26 parts by mass of phosphor particles composed of $Y_3Al_5O_{12}$:Ce (in a sphere shape, the average particle size of 8 μm) and 74 parts by mass of a silicone resin (addition reaction type silicone resin, kinetic viscosity (at 25° C.) of 20 $mm^2$/s, manufactured by WACKER ASAHIKASEI SILICONE CO., LTD.) were blended and stirred uniformly, so that a phosphor composition was prepared.

Next, the prepared phosphor composition was applied onto the upper surface of the light semiconductor layer (the buffer layer) and that of the encapsulating resin layer exposing the light semiconductor layer, so that a phosphor film in a sheet state was formed. Thereafter, the formed phosphor film was dried at 100° C., so that the phosphor layer in a sheet state having the above-described pattern was formed.

In this way, a light emitting diode element including the phosphor layer, the light semiconductor layer, and the electrode portion was formed. And a light emitting diode device including a base board and the light emitting diode element that was flip mounted on the base board was produced.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a light emitting diode device, provided with a base board including a terminal and a light emitting diode element flip mounted on the base board, comprising preparing the base board;

allowing a light semiconductor layer where an electrode portion is provided at one side in a thickness direction to be disposed in opposed relation to the base board in the thickness direction, and the electrode portion to be electrically connected to the terminal, so that the light semiconductor layer is flip-chip mounted on the base board;

forming an encapsulating resin layer containing a light reflecting component on a side of the base board having the light semiconductor layer and an electrode portion so as to embed the light semiconductor layer and the electrode portion;

removing the encapsulating resin layer so as to expose the light semiconductor layer; and forming a phosphor layer formed in a sheet state so as to be in contact with the exposed surface of the light semiconductor layer to form the light emitting diode element including the phosphor layer, the light semiconductor layer, and the electrode portion.

2. The method for producing the light emitting diode device according to claim 1, wherein in the process of removing the portion of the encapsulating resin layer, the exposed surface of the light semiconductor layer and a remaining surface of the encapsulating resin layer are flush with each other.

* * * * *